(12) United States Patent
Lotter et al.

(10) Patent No.: US 7,017,653 B2
(45) Date of Patent: Mar. 28, 2006

(54) HEAT SINK CLIP MECHANISM

(75) Inventors: Eric M. Lotter, Streamwood, IL (US); Daniel S. Price, Aurora, IL (US)

(73) Assignee: Molex Incorporated, Lisle, IL (US)

(*) Notice: Subject to any disclaimer, the term of this patent is extended or adjusted under 35 U.S.C. 154(b) by 256 days.

(21) Appl. No.: 10/677,884

(22) Filed: Oct. 2, 2003

(65) Prior Publication Data

US 2005/0072556 A1 Apr. 7, 2005

(51) Int. Cl.
*F28F 7/00* (2006.01)
(52) U.S. Cl. ...................... 165/80.3; 165/185
(58) Field of Classification Search ...... 165/80.1–80.3, 165/185; 361/704; 257/718, 719
See application file for complete search history.

(56) References Cited

U.S. PATENT DOCUMENTS

| | | | | |
|---|---|---|---|---|
| 3,571,663 A | * | 3/1971 | Hungate | |
| 5,448,449 A | * | 9/1995 | Bright et al. | 361/704 |
| 5,594,624 A | * | 1/1997 | Clemens et al. | 361/704 |
| 2002/0085357 A1 | * | 7/2002 | Yoneyama et al. | 361/704 |
| 2002/0181205 A1 | * | 12/2002 | Shia et al. | 361/704 |
| 2003/0026073 A1 | * | 2/2003 | McGowan et al. | 361/687 |
| 2003/0209341 A1 | * | 11/2003 | Deboer et al. | 165/80.3 |
| 2004/0156171 A1 | * | 8/2004 | Dong et al. | 361/704 |
| 2004/0231826 A1 | * | 11/2004 | Armstrong | 165/80.3 |

\* cited by examiner

*Primary Examiner*—Teresa J. Walberg
(74) *Attorney, Agent, or Firm*—Robert J. Zeitler

(57) ABSTRACT

A heat sink clip is provided for attaching a heat sink assembly to a universal retention module (URM). The heat sink clip includes a body and a lever attached to the body by way of a pin. The body of the heat sink clip includes engagement portions which engage posts of the URM. The lever of the heat sink clip is pivotally attached to the heat sink assembly. As the lever is pivoted from an open position to a closed position, the pin moves along a bearing surface of the body. Also as the lever is pivoted, the engagement portions of the body interact with the posts of the URM to secure the heat sink assembly to the URM.

31 Claims, 10 Drawing Sheets

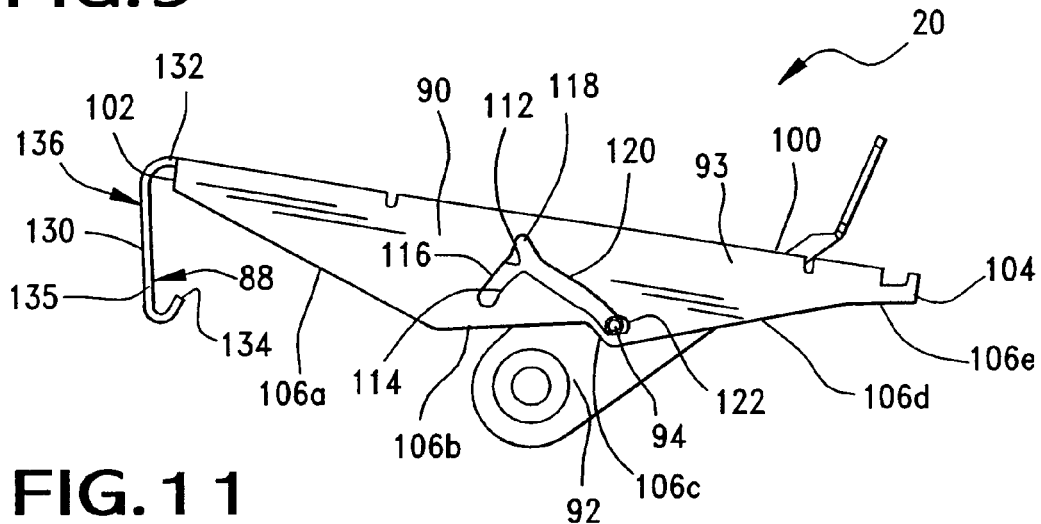
FIG. 9
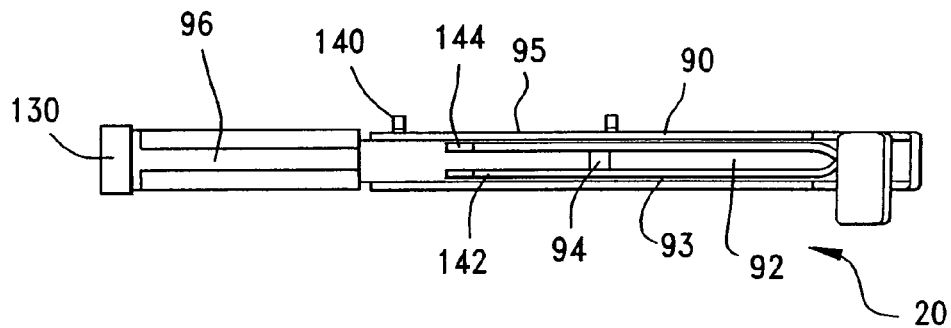
FIG. 11
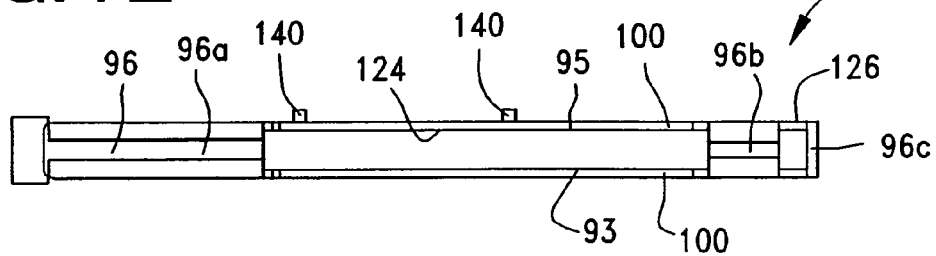
FIG. 12
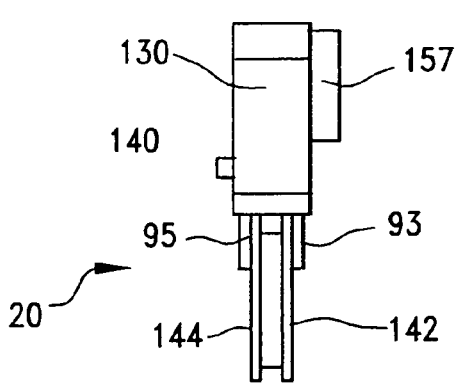
FIG. 10
FIG. 13

FIG.14
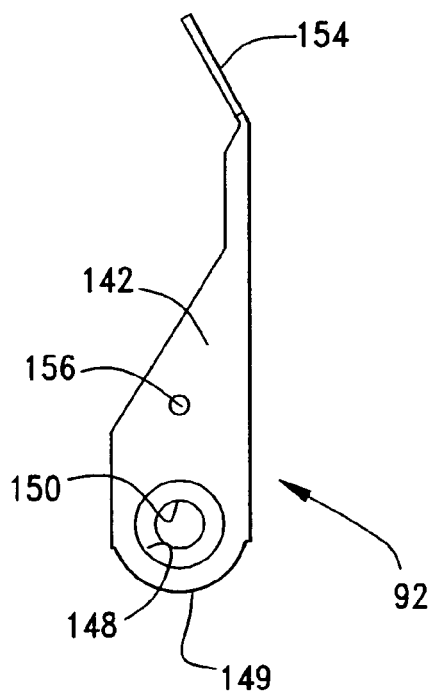
FIG.15
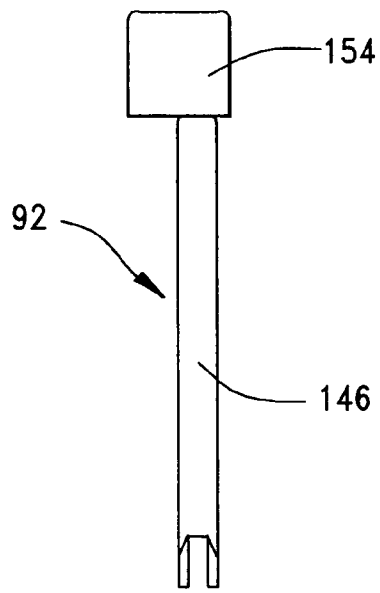
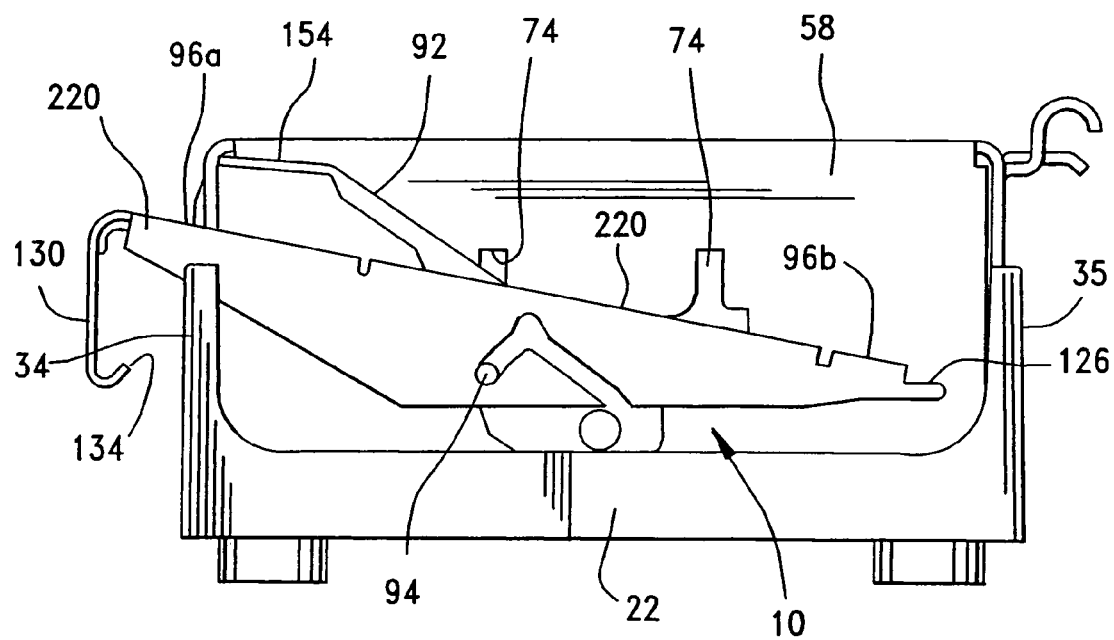
FIG.16

HEAT SINK CLIP MECHANISM

FIELD OF THE INVENTION

The present invention relates to a heat sink assembly, and in particular, to a novel heat sink clip for use in the heat sink assembly.

BACKGROUND OF THE INVENTION

The present invention relates to a heat sink clip for mounting a heat sink assembly to a heat sink mounting structure, such as a universal retention module (URM). Due to the limited space surrounding integrated circuits, a limited amount of space is provided to enable a user to mount or dismount a heat sink assembly. Thus, it is often difficult for a user to mount or dismount a heat sink assembly.

The present invention provides a heat sink clip which allows a user to easily and securely mount and dismount a heat sink assembly to and from a mounting structure despite the limited space available. Other features and advantages will become apparent upon reading the attached description of the invention, in combination with a study of the drawings.

OBJECTS AND SUMMARY OF THE INVENTION

A general object of the present invention is to provide a heat sink clip for mounting a heat sink assembly to a mounting structure, such as a universal retention module (URM).

Another object of the present invention is to provide a heat sink clip which can be operated easily in a confined area.

Yet another object of the present invention is to provide a heat sink clip which requires a low application force to mount the heat sink assembly on the mounting structure.

A further object of the present invention is to provide a heat sink clip which provides a high retention force between a cover of the heat sink assembly and the mounting structure.

A still further object of the present invention is to provide a heat sink clip which moves translationally and vertically relative to a mounting structure.

Briefly, and in accordance with the foregoing, a heat sink clip is provided. The heat sink clip includes a body and a lever attached to the body through a pin. The heat sink clip is easily assembled to the remainder of the heat sink assembly. The body includes an engagement member, an engagement surface, and a bearing surface which is engaged by the pin as the lever is pivoted. Upon application of force to the lever, the engagement member and the engagement surface engage recesses through posts of the mounting structure securing the heat sink assembly to the mounting structure.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 9 is a side elevational view of the heat sink clip;

FIG. 10 is a front elevational view of the heat sink clip;

FIG. 11 is a top elevational view of the heat sink clip;

FIG. 12 is a top elevational view of the body of heat sink clip;

FIG. 13 is a perspective view of the lever of the heat sink clip;

FIG. 14 is a side elevational view of the lever of the heat sink clip;

FIG. 15 is a top elevational view of the lever of the heat sink clip; and

FIGS. 16–21 are right-side elevational views of the heat sink assembly including a modified heat sink clip which incorporates features of the present invention, the heat sink clip assembly being shown moving from an open position to a closed position.

DETAILED DESCRIPTION OF THE ILLUSTRATED EMBODIMENTS

Figure 1:
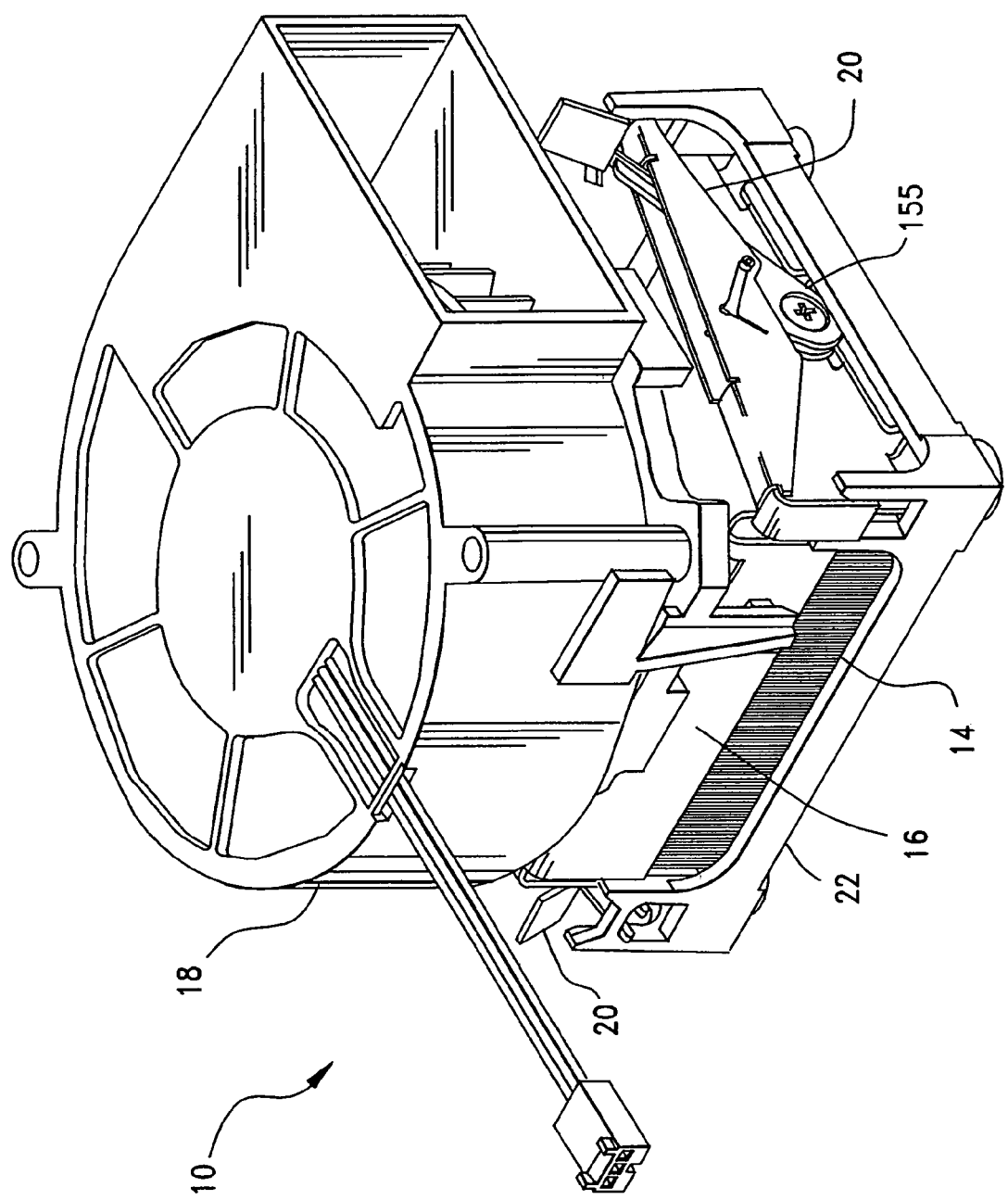
FIG. 1 is a perspective view of a heat sink assembly in which a heat sink clip which incorporates features of the present invention and which is used, mounted to a universal retention module (URM)

While the invention may be susceptible to embodiment in different forms, there is shown in the drawings, and herein will be described in detail, specific embodiments with the understanding that the present disclosure is to be considered an exemplification of the principles of the invention, and is not intended to limit the invention to that as illustrated and described herein.

A heat sink assembly 10 is shown in FIG. 1. The heat sink assembly 10 includes a heat dissipator 14, a cover 16, a blower 18, and two heat sink clips 20. In brief, the heat sink assembly 10 is used in connection with a mounting structure, such as a universal retention module (URM) or cage 22. The structure of the URM is known in the prior art.

Figure 2:
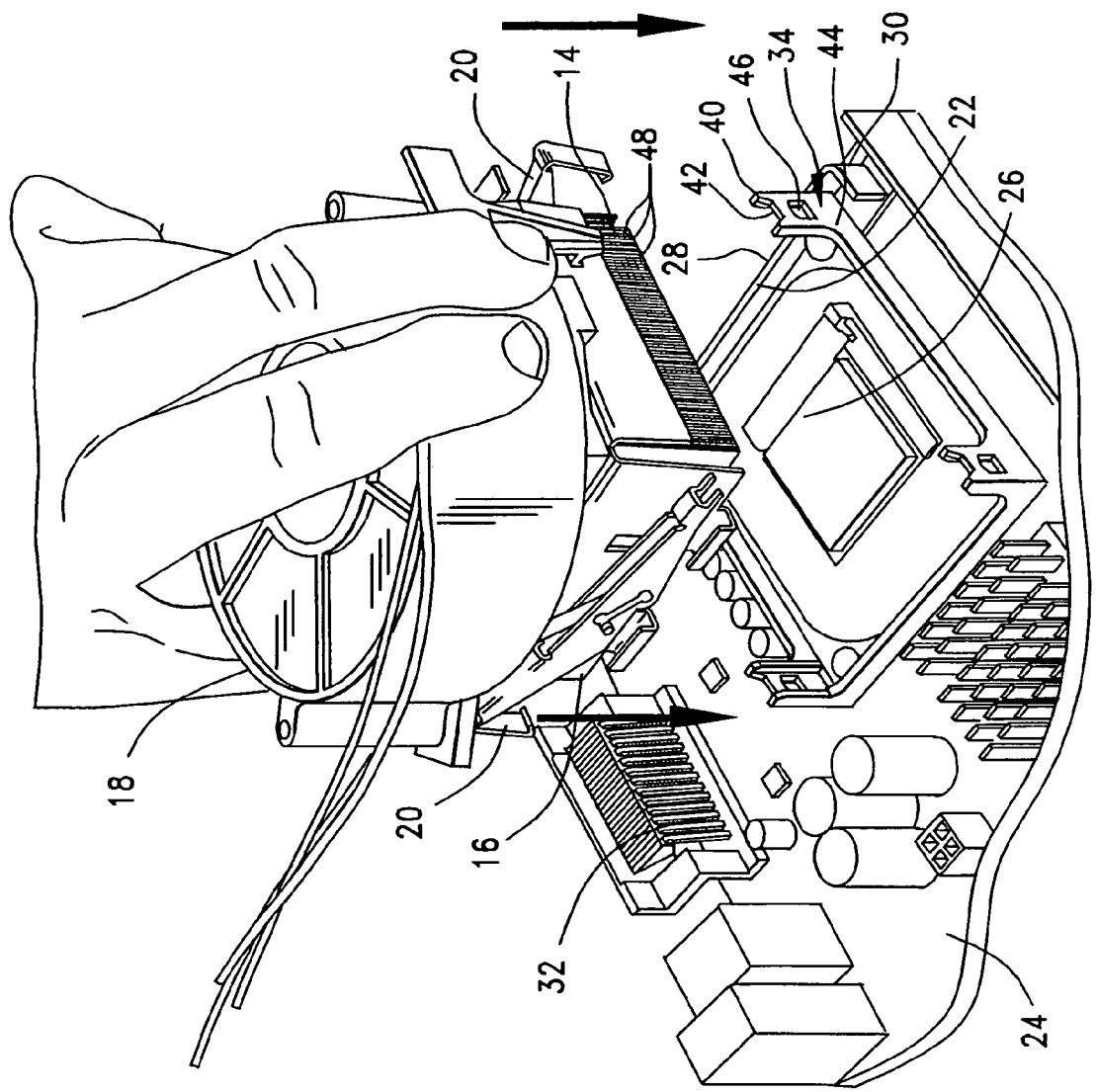
FIG. 2 is a perspective view of the heat sink assembly ready for mounting to the URM.

As shown in FIG. 2, the URM 22 is mounted on a circuit board 24 in a known manner and surrounds a chip 26 from which heat is to be dissipated. The URM 22 is generally rectangularly shaped and includes a base 28, a left front corner post 30, a left rear corner post 32, a right front corner post 34, and a right rear corner post 35 (see FIG. 27) extending upwardly and perpendicularly from the base 28. Each corner post 30, 32, 34, 35 includes an upper end 40, an inner surface 42, an outer surface 44, and an aperture 46 therethrough. The upper end 40 of each corner post 30, 32, 34, 35 is spaced from the circuit board 24. The inner surface 42 of each corner post 30, 32, 34, 35 faces the chip 26 and the outer surface 44 of each corner post 30, 32, 34, 35 is provided opposite the inner surface 42. The aperture 46 through each corner post 30, 32, 34, 35 is rectangularly shaped. Each aperture 46 of each corner post 30, 32, 34, 35 is spaced from the upper end 40 of each corner post 30, 32, 34, 35 and extends from the inner surface 42 to the outer surface 44.

The heat dissipator 14 is also known in the prior art. In brief, the heat dissipator 14 is generally rectangularly shaped and includes a plurality of plates 48 which function to dissipate heat generated by the chip 24. The plates 48 are generally formed from copper and can be formed by either stamping each plate or by folding a sheet of copper to create plates.

As best shown in FIGS. 4–7, the cover 16 is generally rectangularly shaped. The cover 16 is made from metal and is mounted over the heat dissipator 14. The cover 16 includes a top panel 50, a front panel 52, a rear panel 54, a left panel 56 and a right panel 58. The top panel 50 includes a generally circular opening 60 through which heat from the chip 26 is dissipated with the assistance of the blower 18. A tubular shaped support member 62 extends from a rear edge of the top panel 50. The support member 62 receives a pin which extends from the blower 18 as will be described below.

The front and rear panels 52, 54 extend downwardly from the top panel 50 and are generally perpendicular thereto. A blower latch aperture 64 is provided through the front panel 52.

The left panel 56 extends downwardly from the top panel 50 and is generally perpendicular thereto. Two L-shaped motion control apertures 66 are provided through the left panel 56. The motion control apertures 66 are spaced from the bottom edge of the left panel 56 and are spaced from each other. A first portion 66a of each aperture 66 is generally parallel to the top panel 50 and a second portion 66b of each aperture 66 is generally perpendicular to the top panel 50. A mounting aperture 68 is also provided through the left panel 56. The mounting aperture 68 is provided above the bottom edge of the left panel 56 and below the motion control apertures 66. Two spaced apart mounting feet 70 extend outwardly and upwardly from the bottom edge 27 of the left panel 56.

The right panel 58 extends downwardly from the top panel 50 and is generally perpendicular thereto. Two L-shaped motion control apertures 74 are provided through the right panel 58. The L-shaped apertures are spaced from the bottom edge of the right panel 58 and are spaced from each other. A first portion 74a of each aperture 74 is generally parallel to the top panel 50 and a second portion 74b of each aperture 74 is generally perpendicular to the top panel 50. A mounting aperture 76 is also provided through the right panel 58. The mounting aperture 76 is spaced from the bottom edge of the right panel and blow the motion control apertures 74. Two spaced apart mounting feet 78 extend outwardly and upwardly from the bottom edge 80 of the right panel 58.

Figure 3:
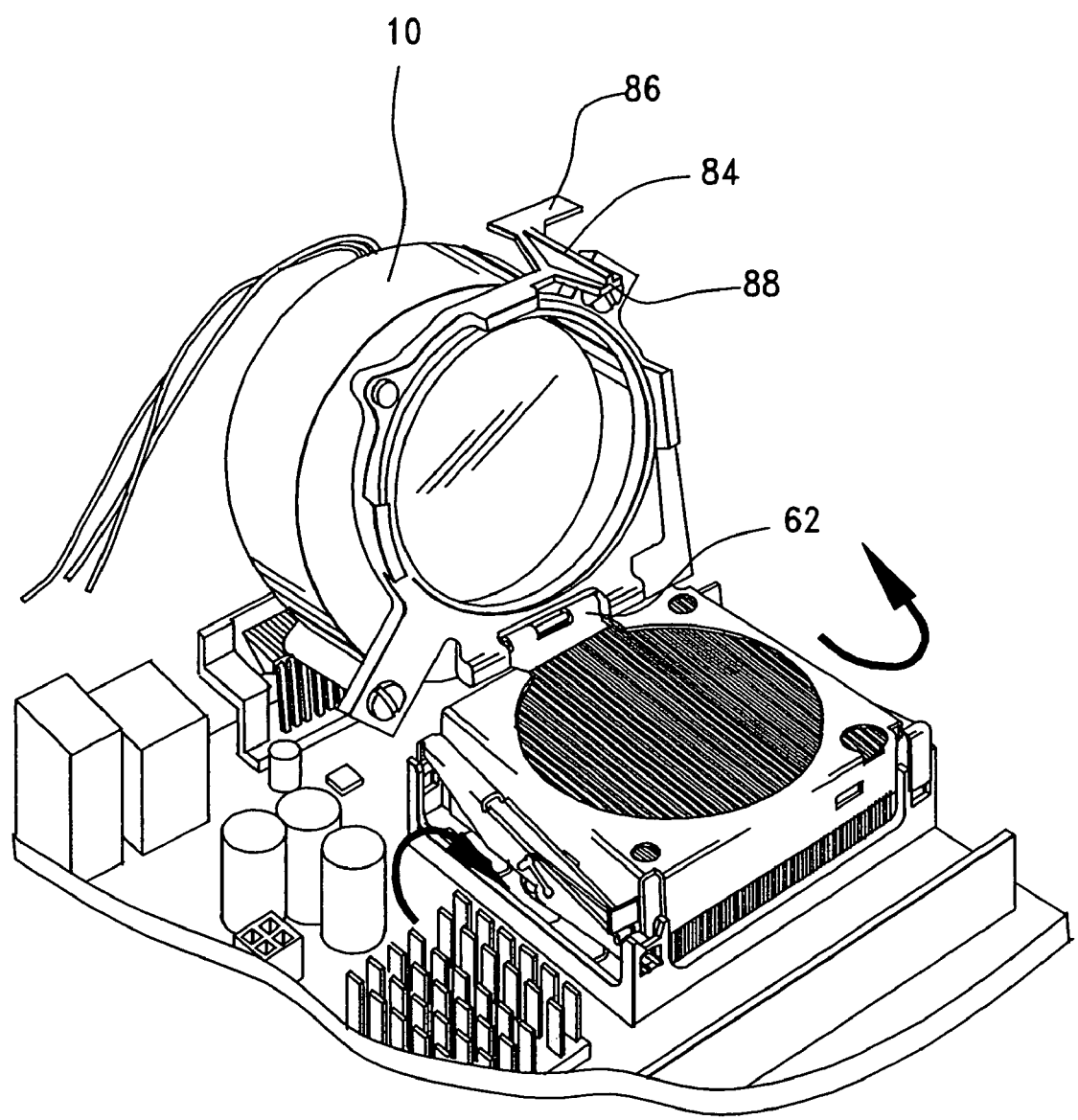
FIG. 3 is a perspective view of the heat sink assembly and the URM with a blower of the heat sink assembly in the open position.
Figure 4:
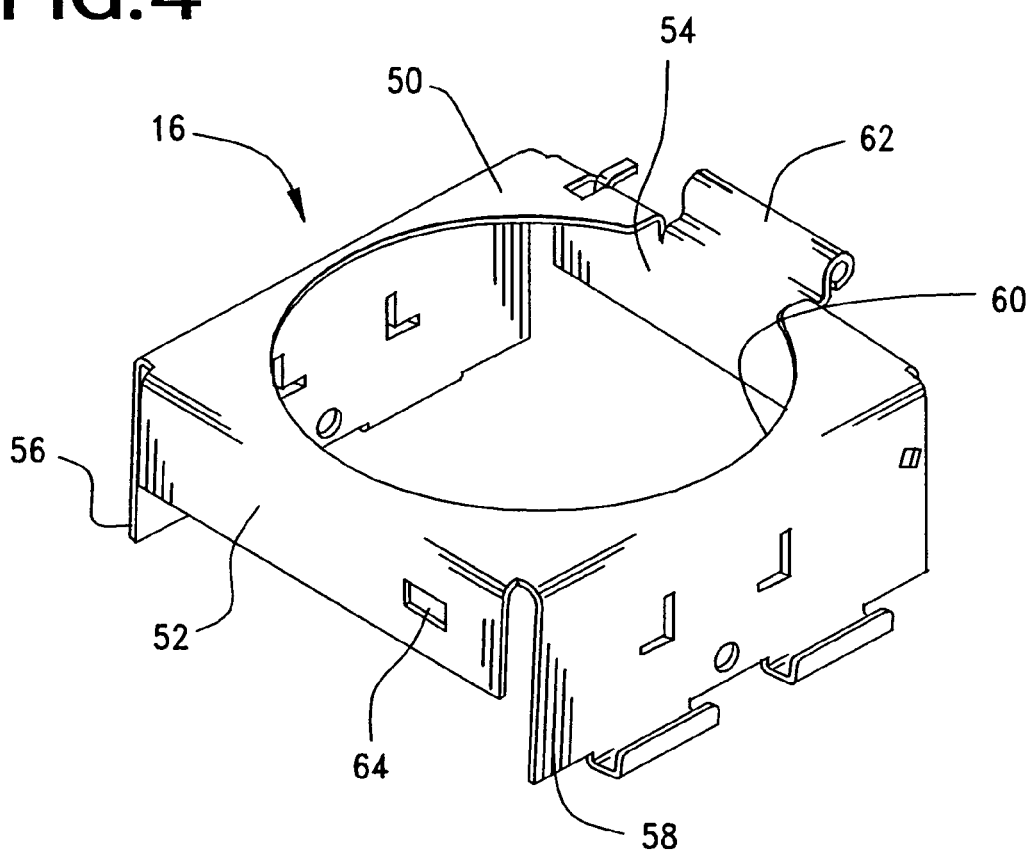
FIG. 4 is a perspective view of a cover of the heat sink assembly of FIG. 3.
Figure 5:
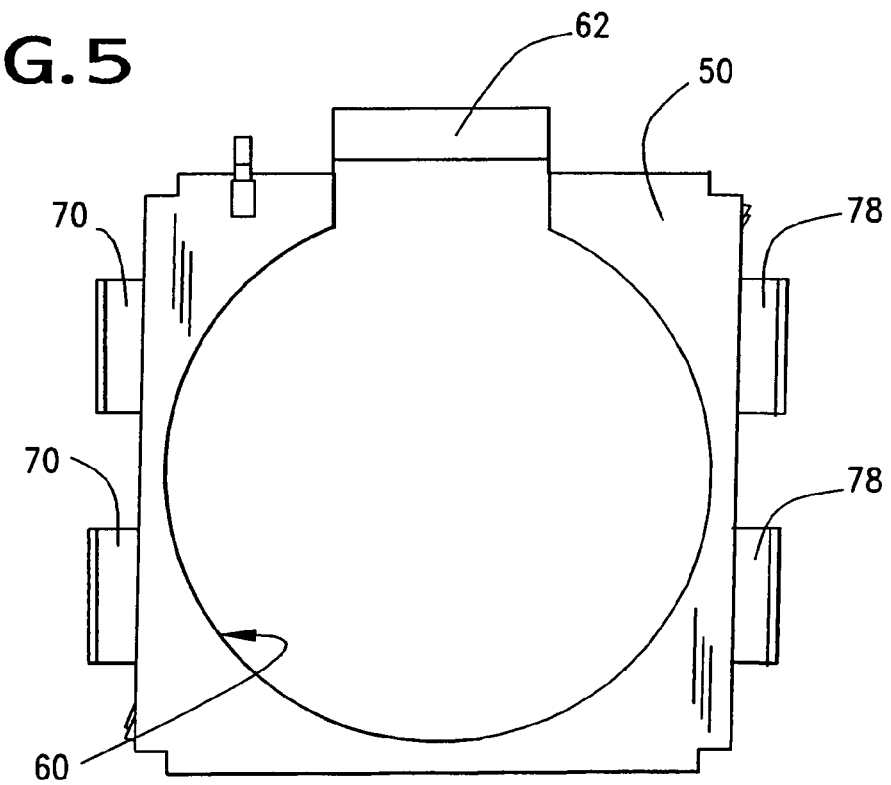
FIG. 5 is a top plan view of the cover of FIG. 4.
Figure 6:
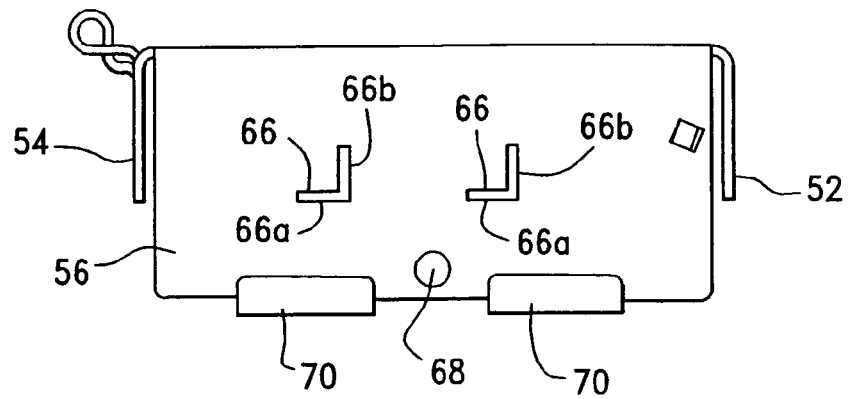
FIG. 6 is a left side elevational view of the cover of FIG. 4.
Figure 7:
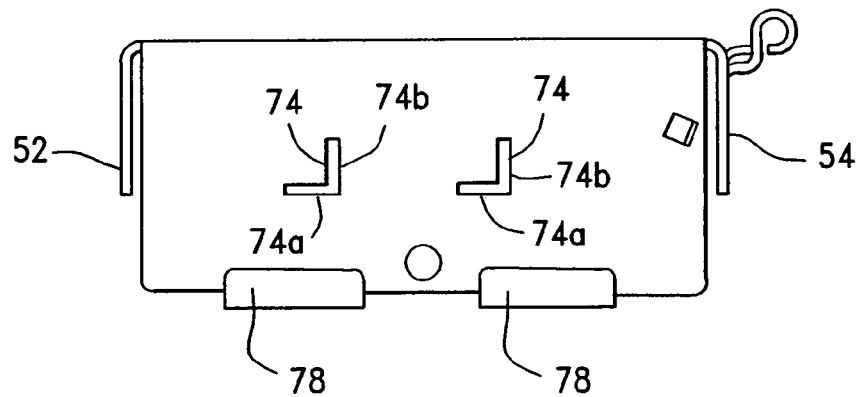
FIG. 7 is a right side elevational view of the cover of FIG. 4.
Figure 8:
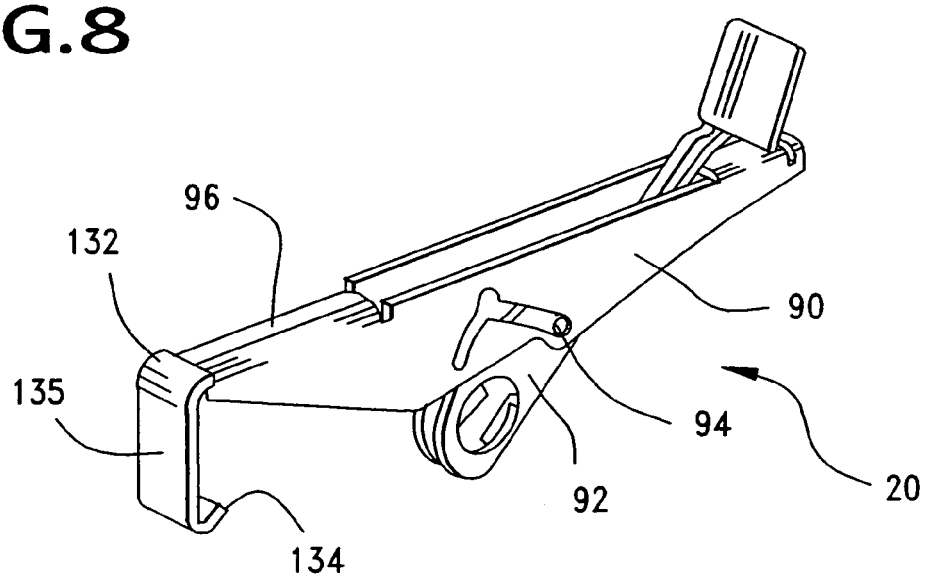
FIG. 8 is a perspective view of the heat sink clip.

As shown in FIGS. 1–3, the blower 18 is mounted on top of the cover 16. A pin (shown in FIG. 3) is provided proximate the bottom surface of the blower 18 and is engaged with the tubular support 62 of the cover 16. The pin and tubular support 62 form a hinge about which the blower 18 can be rotated from the closed position shown in FIG. 1 to the open position shown in FIG. 3. A blower latch 84 extends from the blower 18. The blower latch 84 includes an arm 86 and a locking tab 88. The locking tab 88 engages with the blower latch aperture 64 of the cover 16, as will be described herein.

As shown in FIGS. 1–3, one heat sink clip 20 is provided on the left side of the cover 16 and one heat sink clip 20 is provided on the right side of the cover 16. However, this invention is not limited to those embodiments where the heat sink clip 20 is provided on the cover, but rather, the heat sink clip need only be mounted to the heat dissipater 14. As best shown in FIGS. 8–11, each heat sink clip 20 includes a body 90, a lever 92, and a pin 94. The lever 92 is generally disposed within the body 90 and is retained therein through the engagement of the pin 94 with the body 90 and the lever 92.

The body 90 may be formed from sheet metal or plastic and is generally an elongated piece. The body 90 generally includes an outer panel 93, an inner panel 95 spaced from the outer panel 93, and a top panel 96 which joins the outer and inner panels 93, 95, see FIG. 12. The outer and inner panels 93, 95 are similarly shaped and are parallel to each other. Each of the outer and inner panels 93, 95 is generally elongated and includes a top edge 100, a first end edge 102, a second end edge 104 and a bottom edge 106. The first end edge 102 of each panel 93, 95 extends downwardly and generally perpendicular to the top edge 100. The second end edge 104 of each panel 93, 95 extends downwardly and generally perpendicular to the top edge 100. The bottom edge 106 of each panel 93, 95 is irregularly shaped and includes five segments 106a–106e. A first segment 106a extends downwardly and inwardly from the first end edge 102. The second segment 106b extends inwardly and upwardly from the first segment 106a. The second segment 106b extends from the first segment 106a to the third segment 106c. The third segment 106c extends downwardly from the second segment 106b. The third segment extends from the second segment 106b to the fourth segment 106d. The fourth segment 106d extends upwardly from the third segment 106c. The fourth segment 106d extends from the third segment 106c to the fifth segment 106e. The fifth segment 106e extends from the fourth segment 106d to the second end edge 104.

An inverted, generally V-shaped aperture 110 is provided through each of the outer and inner panels 93, 95, generally above the second segment 106b of the bottom edge 106, such that the apertures 110 are provided approximately at the midpoint of the panels 93, 95. The inverted generally V-shaped apertures 110 of the outer and inner panels 93, 95 are aligned with each other. The apertures 110 include an upper or bearing surface 112 and a lower surface 114. The bearing surface 112 includes a first segment 116, a peak segment 118, a second segment 120, and an end segment 122. The first segment 116 of the bearing surface 112 extends upwardly at an angel toward the peak segment 118.

The peak segment 118 is partially rounded and joins the first and second segments 116, 120. The second segment 120 extends downwardly at an angle from the peak 118 and away from the first segment 116. The second segment 120 is longer than the first segment 116. The magnitude of the slope of the first segment 116 is larger than the magnitude of the slope of the second segment 120. The end segment 122 is provided at the end of the second segment 120 opposite the peak 118. The end segment 122 is angled relative to the second segment 120. The lower surface 114 of the aperture 110 is generally parallel to the bearing surface 112.

As shown in FIG. 12, the top panel 96 includes a first segment 96a, a second segment 96b, and a third segment 96c. The segments 96a, 96b, 96c extend between the top edges 100 of the outer and inner panels 93, 95. A lever opening 124 also extends between the top edges 100 of the outer and inner panels 93, 95. The lever opening 124 allows the lever 92 to extend above the top edges 100 of the outer and inner panels 93, 95 of the body 90. Portions of the top edges 100 of the outer and inner panels 93, 95 are exposed to form an engagement surface 126. The first segment 96a of the top panel 96 extends from the first end of the body 90 to the lever opening 124. The lever opening 124 extends from the first segment 96a to the second segment 96b. The second segment extends from the lever opening 124 to the engagement surface 126. The engagement surface 126 extends from the second segment 96b to the third segment 96c. The third segment 96c extends from the engagement surface 126 to the second end of the body 90.

An engagement member 130 extends from the first end of the body 90. The engagement member 130 includes a fixed end 132, a free end 134, and a middle portion 135 between the fixed end 132 and the free end 134. The fixed end 132 of the engagement member 130 is attached to the top panel 96 of the body 90 and the middle portion 135 extends downwardly therefrom. The free end 134 is provided on the middle portion 135 opposite the fixed end 132. The free end 134 is generally hook-shaped such that it is turned inwardly toward the outer and inner panels 93, 95 and upwardly.

Two spaced apart guide pins 140 extend outwardly from the inner panel 95. The guide pins 140 engage the L-shaped motion control apertures 66, 74 of the left and right panels 56, 58 of the cover 16 as will be described herein.

As best shown in FIGS. 13–15, the lever 92 of the heat sink clip 20 includes an outer panel 142, an inner panel 144 identical in shape to the outer panel 142 and spaced therefrom; a top panel 146, and a thumb latch 154. The lever 92 is formed of metal or plastic. A mounting aperture 148 is provided through the outer panel 142 proximate the mounting end 149 of the lever 92 opposite the thumb latch 154. A mounting aperture 150 is provided through the inner panel 144 proximate the mounting end 149 of the lever 92 opposite the thumb latch 154. Although spaced apart, the apertures 148, 150 are concentrically aligned. The diameter of the mounting aperture 148 is larger than the diameter of the mounting aperture 150.

The top panel 146 generally extends between a portion of the outer panel 142 and a portion of the inner panel 144 of the lever 92. A thumb latch 154 extends from the top panel 146. The thumb latch 154 is angled relative to the remainder of the top panel 146.

A pin aperture 156 is provided through each of the outer and inner panels 142, 144. The pin aperture 156 of each panel 142, 144 is spaced between the mounting apertures 148, 150 and the thumb latch 154. The pin aperture 156 of the outer panel 142 is aligned with the pin aperture of the inner panel 144.

If the body 90 is formed from metal, the body 90 is preferably formed by providing a flat sheet which is stamped to provide the outer panel 93, the inner panel 95, the top panel 96, and the engagement member 130. The stamped metal is then folded so as to bring the outer and inner panels 93, 35 parallel to each other. The engagement member 130 is formed by folding the engagement member relative to the top panel. When the sheet is flat, appropriate cuts are stamped in the inner panel 95 to release portions of the inner panel. These portions are folded perpendicular to the inner panel 95 to form the guide pins 140.

If the lever 92 is formed from metal the lever 92 is preferably formed by providing a flat sheet which is stamped to provided the outer panel 142, the inner panel 144, and the top panel 46. The stamped metal is then folded so that the outer and inner panels 142, 144 are parallel to each other.

To assemble the heat sink clip 20, when it is formed of metal, the lever 92 is placed between the outer and inner panels 93, 95 of the body 90 such that the outer panel 142 of the lever 92 is proximate the outer panel 93 of the body 90 and the inner panel 144 of the lever 92 is proximate the inner panel 95 of the body 90. The pin apertures 156 of the lever 92 are then aligned with the inverted, generally V-shaped apertures 110 of the body 90 and the pin 94 is passed through the inverted, generally V-shaped aperture 110 of the outer panel 93 of the body 90, through the pin apertures 156 of the outer and inner panels 142, 144 of the lever 92, and then through the inverted, generally V-shaped aperture 110 of the inner panel 95 of the body 90. The pin apertures 156 of the lever 92 are sized such that the pin 94 fits tightly within the pin apertures 156. The inverted, generally V-shaped apertures 110 of the body 90 is sized such that the pin 94 moves freely within the inverted, generally V-shaped apertures 110. The pin 94 is preferably a spring pin.

If the heat sink clip 20 is formed from plastic, molds are used to form the body 90 and the lever 92 of the heat sink clip. The pin 94 will be integrally formed with the lever 92. To assemble the lever 92 and the body 90, the lever 92 would be placed between the outer and inner panels 93, 95 of the body 90 such that the outer panel 142 of the lever 92 is proximate the outer panel 93 of the body 90 and the inner panel 144 of the lever 92 is proximate the inner panel 95 of the body 90. The integrally formed pin 94 is aligned with the aperture 110 of the body and the pin 94 snaps within the apertures 110 of the body 90.

The heat sink clips 20 are then mounted to the remainder of the heat sink assembly 10. A heat sink clip 20 is mounted to the left panel 56 of the cover 16 by placing the inner panel 95 of the body 90 proximate the left panel 56, placing the guide pines 140 within the motion control openings 66, aligning the mounting apertures 148, 150 of the lever 92 with the mounting aperture 68 of the cover 16 and passing a fastener, such as a screw 155 (see FIG. 1), through the mounting apertures 148, 150, 68 and securing the screw 155 to the lever 92 and the cover 16. The head of the screw 155 is sized such that the head passes through the aperture 148 of the lever 92. With the heat sink clip 20 mounted to the left panel 56, the retaining pins 140 respectively extend through the L-shaped motion control apertures 66 of the left panel 56 of the cover 16. A heat sink clip 20 is mounted to the right panel 58 of the cover 16 in an identical manner.

The heat sink assembly 10 is then mounted to the URM 22. The heat sink assembly 10 is oriented with the URM 22 such that the heat sink clip 20 mounted to the left panel 56 of the cover 16 is generally positioned between the left rear post 32 and the left front post 30 and the heat sink clip 20 mounted to the right panel 58 of the cover 16 is generally positioned between the right rear post 35 and the right front post 34. As the heat sink assembly 10 is lowered the engagement member 130 of the heat sink clip 20 mounted to the left panel 56 of the cover 16 will rest outside the left rear post 32 and the engagement member 130 of the heat sink clip 20 mounted to the right panel 58 of the cover 16 will rest outside of the right front post 34.

After the heat sink assembly 10 has been placed within the URM 22, the arm 86 of the blower latch 84 is depressed so as to release the engagement tab 88 of the blower latch 84 from the blower latch recess 64 of the cover 16. The blower 18 is then rotated approximately ninety degrees about the pin and tubular structure 62, as shown in FIG. 3 to place the blower 18 in an open position.

With the blower 18 in an open position, the user can easily access the heat sink clips 20. The heat sink clips 20 are used to secure the heat sink assembly 10 to the URM 22. As the levers 92 of the heat sink clips 20 are pivoted about the mounting screws 155, the pin 94 of each clip 20 rides along the bearing surface 112 of the generally V-shaped aperture 110. When the clip 20 is in the open position, the thumb latch 154 of the lever 92 is proximate the first segment 96a of the top panel 96 of the body 90 and the pin 94 is at the lower end of the first segment 116 of the bearing surface 112. When the clip 20 is in the closed position as shown in FIG. 9, the thumb latch 154 of the lever 92 is proximate the second segment 96b of the top panel 96 of the body 90. In addition, the pin 94 is at the end segment 122 of the bearing surface 112.

As the lever 92 of each heat sink clip 20 is rotated, the engagement member 130 and the engagement surface 126 interact with the apertures 46 of the corner posts 30, 32, 34, 35 of the URM 22. The interaction between the URM 22 and the heat sink clip 20 is shown in FIGS. 16–21. The motion control openings 66, 74 of the left and right panels 56, 58 of the heat sink cover 16, limit the clip motion to horizontal movement only, vertical movement only, or a combination of both vertical and horizontal movement. As shown in FIGS. 16–21 rotation of the lever 92, results in a combination of translation and vertical displacement of the heat sink clip 20 relative to the URM 22.

A modified embodiment of the heat sink clip 20 is shown in FIGS. 16–21 mounted to the right panel 58 of the cover 16. The heat sink clip 220 is identical to the heat sink clip 20 except for the differences in the body 90 of the heat sink clip 220 described herein. The bearing surface 112 does not include an end segment 122. In addition, the top panel 96 of the body 90 does not include a third segment 96c.

Figure 17:
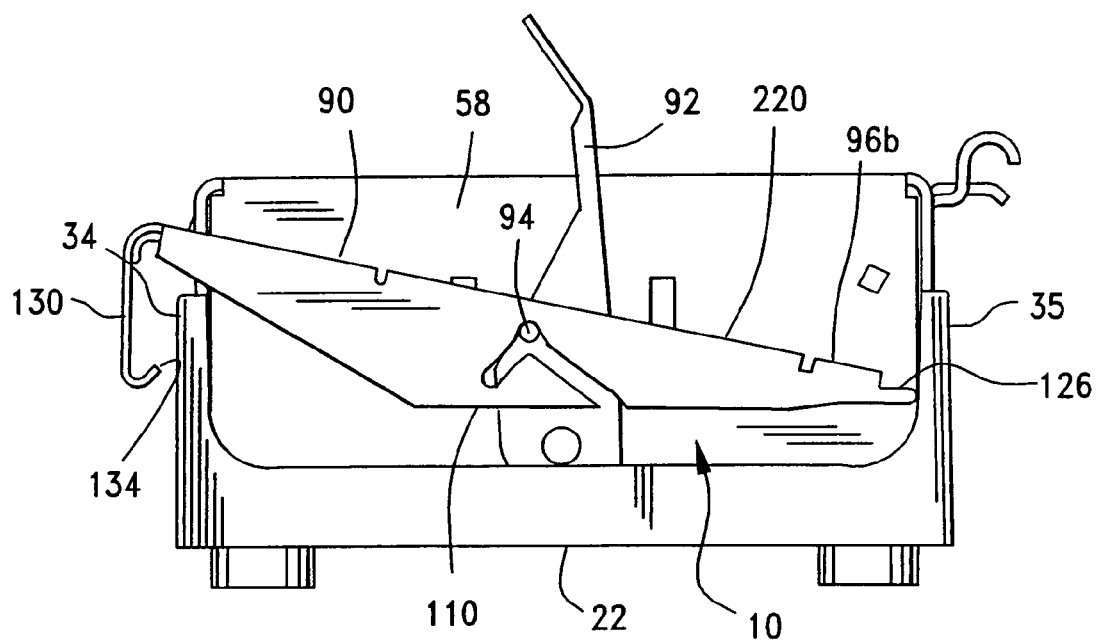
Figure 18:
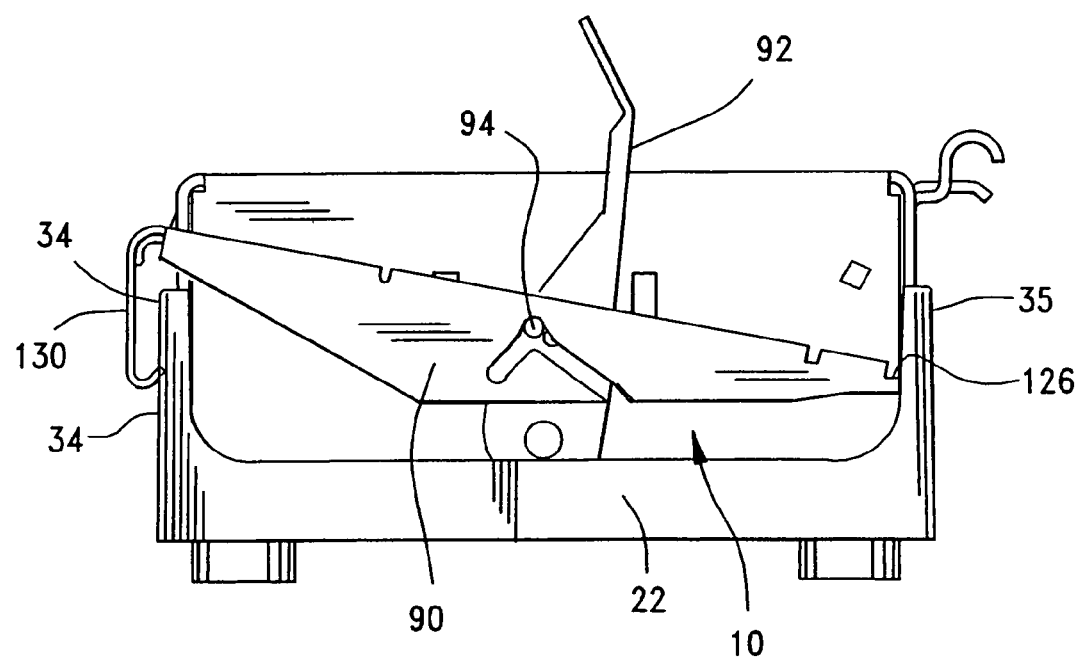
Figure 19:
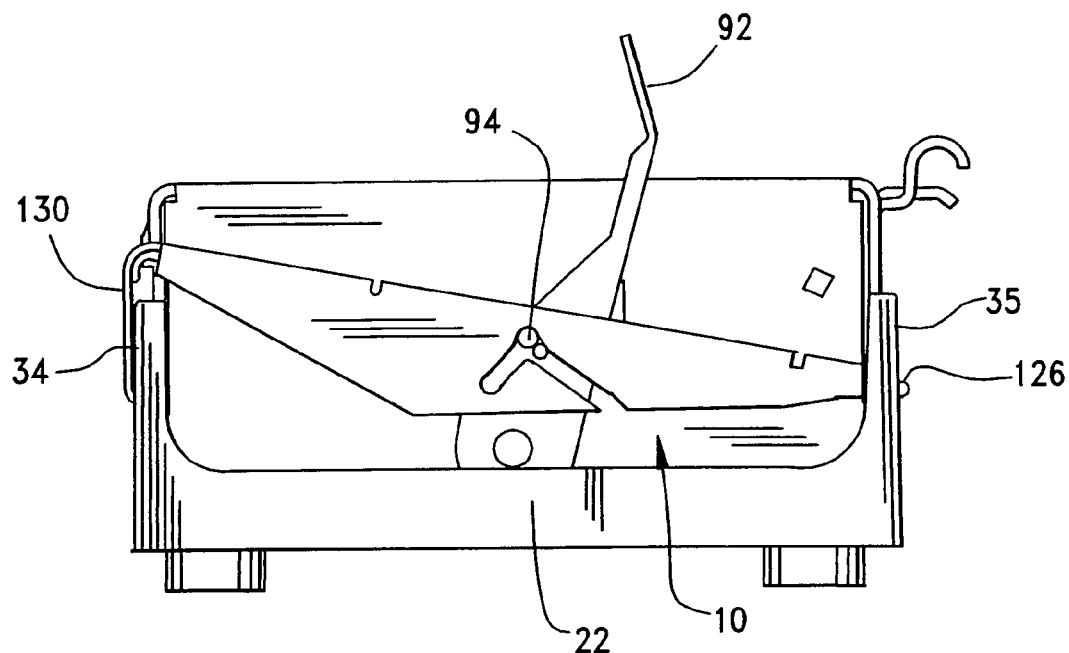
Figure 20:
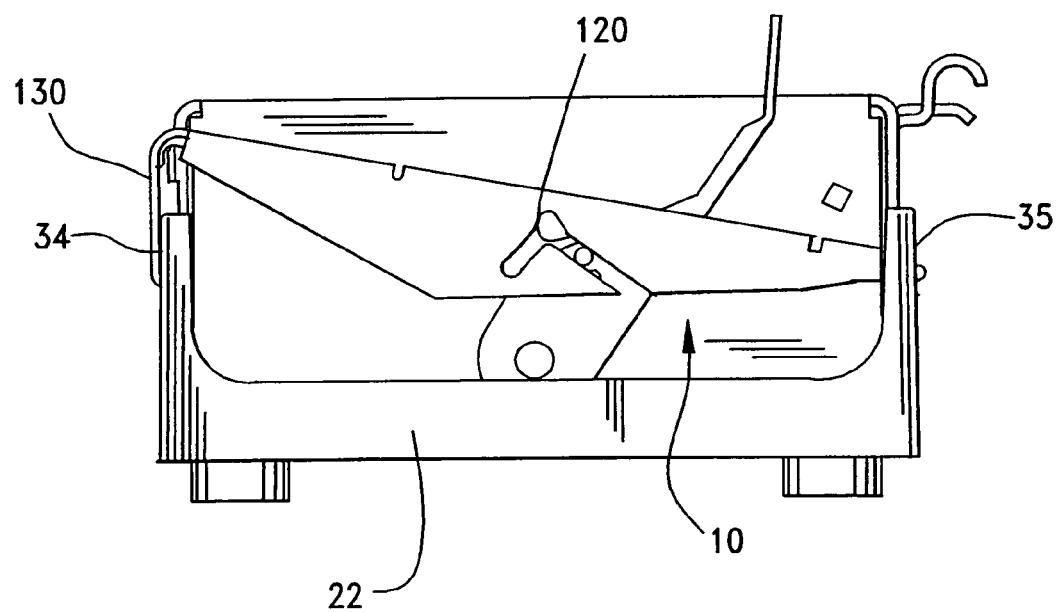
Figure 21:
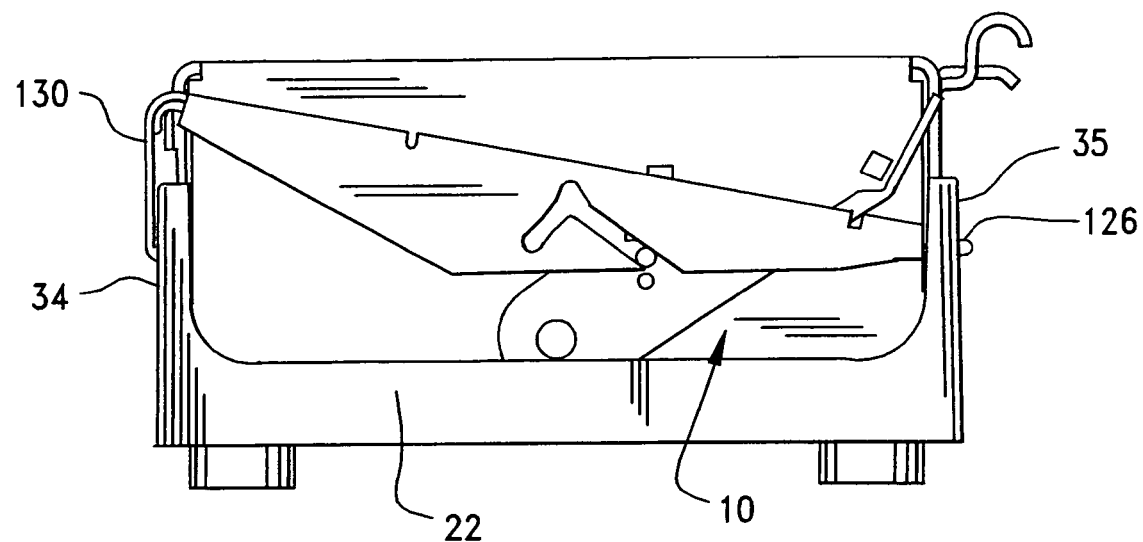

As shown in FIG. 16 with the heat sink clip 220 in the open position, the engagement member 130 extends beyond the right front post 34 and the engagement surface 126 is to the left of the right rear post 35. As the lever 92 is rotated in the clockwise direction, the pin 94 moves along the first segment 116 of the bearing surface 112 of the aperture 110 upward until the pin reaches the peak segment 118 of the bearing surface 112 as shown in FIG. 17. As the pin 94 travels upward, the body 90 of the clip 20 translates by moving toward the right such that the engagement member 130 moves closer to the post 34 and the engagement surface 126 moves closer to the post 35. As shown in FIG. 18, as the user continues to rotate the lever 92, the pin 94 remains in contact with the peak 118 of the bearing surface 112. In addition, the body 90 of the clip 220 translates further to the right such that the engagement member 130 is brought closer to the post 34 and the engagement surface 126 is brought closer yet to the post 35. As shown in FIG. 18, as the user continues to rotate the lever 92, the body 90 continues to translate to the right and the free end 134 of the engagement member 130 moves within the aperture 46 in the post 34 and the right end of the body 90, including the engagement surface 126, moves within the aperture 46 of the post 35. As shown in FIG. 19, as the user continues to rotate the lever 92, the pin 94 begins downwardly along the second segment 120 of the bearing surface 112, and body 90 translates to the right and the engagement member 130 and the engagement surface 126 of the body 90 move further within the apertures 46. As shown in FIG. 20, as the user continues to rotate the lever 92 further yet, the pin 94 continues to move downwardly along the second segment 120 of the bearing surface 112. As a result, the body 90 moves upwardly relative to the URM 22 such that the engagement member 130 and the engagement surface 126 move upwardly within the apertures 46. As shown in FIG. 21, as the user continues to rotate the lever 92, the clip 20 reaches the closed position. In this position, the lever 92 rests against the second portion 96b of the top panel 96 of the body 90. In the closed position, the free end 134 of the engagement member 130 is positioned proximate the inner surface of the post 34 and engages the upper wall of the aperture 46 in the post 34. Also, in the closed position the top surfaces 100 of the front and back panels 93, 95 at the engagement surface 126 engage the upper wall of the aperture 46 in the post 35. With the heat sink clip 220 in the closed position, a high retention force securely attaches the heat sink assembly 10 to the URM 22.

If the heat sink clip 20 shown in FIGS. 1–15 were used to assemble the heat sink assembly 10 with the URM, when the lever 92 reaches the closed position, the pin 94 rests in the end segment 122 of the aperture 110. Thus, although only a low application forces is required to close the heat sink clip, because the end segment 122 is not co-linear with the second segment 120 of the aperture 110, a high retention force is provided by the end segment 122 resulting in a "locking" feature which helps to maintain the clip 20 in the closed position.

As shown, the clip 20 is opened and closed by rotating the lever 92 about an axis of rotation provided by the screw mounted 155 through the apertures 148, 150 in the lever 92.

Because the pin 94 is outside this axis of rotation, the clip 20 is self-energizing. Thus, although a high retention force is provided between the heat sink assembly 10 and the URM 22, use of the heat sink clip 20 requires only a low application force.

After the levers 92 have been placed in the closed position, the blower 18 is returned to its closed position by rotating the blower 18 about the hinge formed by the pin extending from the bottom of the blower 18 and the tubular support 62 of the cover 16. When the blower 18 is in the closed position, the locking tab 88 of the blower latch 84 will engage with the blower latch aperture 64 of the cover 16.

Although the bearing surfaces 112 of the body 90 have been shown in connection with inverted, generally V-shaped apertures 110. It is to be understood that the apertures 110 could take on numerous shapes. For example, because the pin 94 bears on the bearing surfaces 110 and are not supported by the lower surfaces 114 of the generally V-shaped apertures, the lower surfaces 114 can be of essentially any shape, so long as the lower surfaces 114 do not interfere with the movement of the pin 94. If desired, for example, the aperture 110 could be triangularly shaped, such that the lower surface 114 would extend directly from the lower end of the first segment 116 of the bearing surface to the end segment 122. In yet another example, the inverted, generally V-shaped apertures 110 could be provided without lower surfaces 114. In such an instance the apertures would simply open toward the lower edges of the body 90.

Although the engagement surface 126 has been described as a portion of the outer and inner panels 93, 95 of the body 90, it is not necessary for the engagement surface 126 to be formed in this manner. Rather, a generally horizontal surface for engagement with the post of the URM 22 is only necessary. Thus, the engagement surface 126, could for example, be provided by a portion of the top panel 96. Likewise, although the engagement member 130 has been described as hook-shaped, the engagement member 130 can be formed in any manner suitable for engaging the post of the URM. For example, rather than providing an upwardly turned hook-shaped end, the free end 134 of the engagement member 130 could be provided perpendicular to the middle portion 135 of the engagement member 130. In such an instance, the free end 134 of the engagement member 130 would engage only the top surface of the recess 46 of the post. In addition, wherein this invention has been described in relation to a heat sink assembly whereby the blower 18 pivots about the cover, this invention is not limited to such an application.

While preferred embodiments of the present invention are shown and described, it is envisioned that those skilled in the art may devise various modifications of the present invention without departing from the spirit and scope of the appended claims.

What is claimed is:

1. A heat sink clip for use in attaching a heat sink to a mounting structure, the mounting structure including at least first and second posts, the heat sink clip comprising:
   a body having an outer panel, an inner panel, a bearing surface on at least one of the outer and inner panels, a first engagement portion, and a second engagement portion;
   a lever pivotally attached to the heat sink;
   a pin attached to the lever and in communication with the bearing surface of the body; and
   wherein when the lever is pivoted from an open position to a closed position, the pin contacts the bearing surface of the body, the first engagement portion engages the first post of the mounting structure and the second engagement portion engages the second post of the mounting structure.

2. A heat sink clip as defined in claim 1, wherein the body includes a bearing surface on the outer panel of the body and a bearing surface on the inner panel of the body.

3. A heat sink clip as defined in claim 1, wherein the bearing surface of the body is an inverted, generally V-shaped slot.

4. A heat sink clip as defined in claim 3, wherein the inverted, generally V-shaped slot includes a first segment, a peak segment, and a second segment, wherein the first segment is upwardly sloped, the second segment is downwardly sloped and the peak segment is provided between the first segment and the second segment.

5. A heat sink clip as defined in claim 4, wherein a magnitude of the slope of the first segment is greater than a magnitude of the slope of the second segment.

6. A heat sink clip as defined in claim 4 wherein the first segment of the inverted, generally V-shaped slot is shorter than the second segment of the inverted, generally V-shaped slot.

7. A heat sink clip as defined in claim 4, wherein the inverted generally V-shaped slot further includes an end segment, wherein the end segment is provided at an end of the second segment opposite the peak segment, and wherein the end segment is angled relative to the second segment.

8. A heat sink clip as defined in claim 1, wherein the first engagement portion includes a fixed end and a free end, the free end of the first engagement portion engaging with the first post.

9. A heat sink clip as defined in claim 8, wherein the free end is hook-shaped.

10. A heat sink clip as defined in claim 1, wherein an upper edge of the outer and inner panels of the body form the second engagement portion.

11. A heat sink clip as defined in claim 1, the heat sink including motion control apertures therethrough, wherein the body further includes guide pins extending from the inner panel for engagement with the motion control apertures.

12. A heat sink clip as defined in claim 1, wherein the lever further includes an outer panel with a mounting aperture therethrough, an inner panel with a mounting aperture therethrough, wherein the mounting aperture through the outer panel is aligned with the mounting aperture through the inner panel and the mounting aperture through the outer panel is larger than the mounting aperture through the inner panel, and wherein a fastener is passed through the mounting apertures to secure the heat sink clip to the heat sink and the head of the fastener passes through the mounting aperture of the outer panel.

13. A heat sink clip as defined in claim 1, wherein the lever further includes a thumb latch.

14. A heat sink clip as defined in claim 1, wherein the bearing surface of the body is an inverted, generally V-shaped slot including an upwardly sloped first segment, a downwardly sloped second segment and a peak segment between the first segment and the second segment, wherein when the lever is in the open position the pin is positioned near a lower end of the first segment and when the lever is in the closed position the pin is positioned near the lower end of the second segment.

15. A heat sink clip as defined in claim 14, wherein the inverted, generally V-shaped slot further includes an end segment at the end of the second segment opposite the peak segment and when the lever is in the closed position the pin contacts the end segment of the inverted generally V-shaped slot.

16. A heat sink clip as defined in claim 11, wherein the motion control apertures limit movement of the heat sink clip to horizontal movement only.

17. A heat sink clip as defined in claim 11, wherein the motion control apertures limit movement of the heat sink clip to vertical movement only.

18. A heat sink clip as defined in claim 11, wherein the motion control apertures allows movement of the heat sink clip in both the vertical and horizontal direction.

19. A heat sink clip as defined in claim 1, wherein a heat sink cover is placed in direct communication with the heat sink, and the lever is attached to the heat sink cover.

20. A heat sink clip as defined in claim 19, wherein the heat sink cover includes motion control apertures.

21. A heat sink cover and at least one heat sink clip, in combination:
the heat sink cover comprising a left panel and a right panel;
the heat sink clip comprising a body having an outer panel, an inner panel, a bearing surface on at least one of the outer and inner panels, a first engagement portion, a second engagement portion, a lever pivotally attached to the left or right panel of the heat sink cover, a pin attached to the lever and in communication with the bearing surface of the body; and
wherein when the lever is pivoted from an open position to a closed position, the pin moves along the bearing surface of the body.

22. The heat sink cover and heat sink clip combination of claim 21, wherein the heat sink cover further includes motion control apertures through the left or right panel and the body of the heat sink clip further includes guide pins extending from the inner panel of the body, and wherein as the lever is moved from the open position to the closed position the guide pins move within the motion control apertures.

23. The heat sink cover and heat sink clip combination of the claim 22, wherein the motion control apertures of the heat sink cover are generally L-shaped.

24. A mounting structure, a heat sink cover, and at least one heat sink clip in combination:
the mounting structure comprising a base including at least first and second posts extending upwardly therefrom;
a cover comprising left and right panels;
the heat sink clip comprising a body having an outer panel, an inner panel, a bearing surface on at least one of the outer and inner panels, a first engagement portion, a second engagement portion, a lever pivotally attached to the left or right panel of the heat sink cover, a pin attached to the lever and in communication with the bearing surface of the body; and
wherein when the lever is pivoted from an open position to a closed position, the pin moves along the bearing surface of the body, the first engagement portion engages the first post of the mounting structure and the second engagement portion engages the second post of the mounting structure.

25. The combination as defined in claim 24, wherein the first engagement portion includes an inner surface and an outer surface, wherein the first post of the mounting structure includes an inner surface and an outer surface, and wherein the heat sink clip is aligned with the mounting structure such that the inner surface of the first engagement portion is positioned proximate the outer surface of the first post of the mounting structure.

26. The combination as defined in claim 24, wherein the first engagement portion includes a fixed end and a hook-shaped free end.

27. A method of attaching a heat sink assembly having a heat sink cover to a mounting structure comprising the steps of:
providing a mounting structure have a base and at least first and second posts extending upwardly therefrom;
providing a heat sink cover comprising left and right panels;
providing a body of a heat sink clip having an outer panel, an inner panel a bearing surface on at least one of the outer and inner panels, a first engagement portion, and a second engagement portion;
providing a lever;
providing a pin;
mounting the lever within the body;
and pivotally attaching the lever to the cover;
aligning the cover and heat sink clip with the mounting structure such that the left or right panel of the cover is positioned between the first and second posts of the mounting structure and the first engagement portion of the body extends proximate the outer surface of the first post of the mounting structure;
pivoting the lever from an open position to a closed position so as to move the pin along the bearing surface.

28. The method of claim 27, wherein the bearing surface of the body of the heat sink clip is an inverted, generally V-shaped slot, the body further includes retaining pins extend from the inner panel, and the cover further includes motion control apertures through the left and right panels, and wherein the step of pivoting the lever causes the clip to move the transversely and vertically relative to the mounting structure.

29. The method of claim 27, wherein the heat sink clip is formed from plastic and the pin is integrally formed with the lever and the step of attaching the lever to the body includes snap fitting the pin within the body.

30. The method of claim 27, wherein the heat sink clip is formed from metal, the lever further includes pin apertures, and the step of mounting the lever within the body includes placing the lever between the outer and inner panels of the body, aligning the bearing surface with the pin apertures and passing the pin through the pin apertures.

31. The method of claim 27, wherein the lever of the heat sink clip further includes mounting apertures and the step of pivotally attaching the lever to the heat sink cover further includes the step of passing a fastener through the mounting apertures prior to attaching the lever to the cover.

* * * * *